(12) United States Patent
Khlat (10) Patent No.: US 11,742,818 B2
(45) Date of Patent: Aug. 29, 2023

(54) WIDE-BANDWIDTH RESONANT CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 169 days.

(21) Appl. No.: 17/412,764

(22) Filed: Aug. 26, 2021

(65) Prior Publication Data
US 2022/0321083 A1  Oct. 6, 2022

Related U.S. Application Data

(60) Provisional application No. 63/167,712, filed on Mar. 30, 2021.

(51) Int. Cl.
*H03H 7/01* (2006.01)
*H03H 11/10* (2006.01)

(52) U.S. Cl.
CPC ........ *H03H 7/0115* (2013.01); *H03H 7/0138* (2013.01); *H03H 11/10* (2013.01)

(58) Field of Classification Search
CPC ..... H03H 7/0115; H03H 7/0138; H03H 11/10
USPC .......................... 333/213, 216, 217
See application file for complete search history.

(56) References Cited

U.S. PATENT DOCUMENTS

| 6,023,206 A * | 2/2000 | Henderson ............ H01P 1/2016 333/204 |
| 10,333,494 B2 | 6/2019 | Khlat et al. |
| 2017/0093370 A1 | 3/2017 | Khlat et al. |

OTHER PUBLICATIONS

Wang, S. et al., "Negative Capacitance and its Applications on Parasitic Cancellation for EMI Noise Suppression," 2007 IEEE Power Electronics Specialists Conference, Jun. 17-21, 2007, Orlando, FL, USA, IEEE, 5 pages.
Extended European Search Report for European Patent Application No. 22158088.9, dated Aug. 11, 2022, 6 pages.

* cited by examiner

*Primary Examiner* — Rakesh B Patel
(74) *Attorney, Agent, or Firm* — Withrow & Terranova, P.L.L.C.

(57) ABSTRACT

A wide-bandwidth resonant circuit is provided. In an embodiment disclosed herein, the wide-bandwidth resonant circuit includes a positive resonant circuit coupled in parallel to a negative resonant circuit. The positive resonant circuit and the negative resonant circuit can be configured to collectively exhibit certain impedance characteristics across a wide bandwidth. As a result, it is possible to utilize the wide-bandwidth resonant circuit to support a variety of wide-bandwidth applications, such as in a wide-bandwidth signal filter circuit.

20 Claims, 6 Drawing Sheets

WIDE-BANDWIDTH RESONANT CIRCUIT

RELATED APPLICATIONS

This application claims the benefit of U.S. provisional patent application Ser. No. 63/167,712, filed on Mar. 30, 2021, the disclosure of which is incorporated herein by reference in its entirety.

FIELD OF THE DISCLOSURE

The technology of the disclosure relates generally to a resonant circuit, and more specifically an inductor-capacitor (LC) resonant circuit.

BACKGROUND

Wireless devices have become increasingly common in current society. The prevalence of these wireless devices is driven in part by the many functions that are now enabled on such devices for supporting a variety of applications based on a variety of wireless technologies (e.g., wide-area, local-area, and near-field wireless technologies) and in a variety of frequency bands (e.g., licensed and unlicensed bands). The ever-increasing number of frequency bands and demand for higher performance pose extremely challenging filtering demands. While these demands keep raising the complexity of wireless devices, there is a constant need to reduce footprint and improve performance (e.g., bandwidth) of the signal filters that are based thereon.

SUMMARY

Aspects disclosed in the detailed description include a wide-bandwidth resonant circuit. In an embodiment disclosed herein, the wide-bandwidth resonant circuit includes a positive resonant circuit coupled in parallel to a negative resonant circuit. The positive resonant circuit and the negative resonant circuit can be configured to collectively exhibit certain impedance characteristics across a wide bandwidth. As a result, it is possible to utilize the wide-bandwidth resonant circuit to support a variety of wide-bandwidth applications, such as in a wide-bandwidth signal filter circuit.

In one aspect, a wide-bandwidth resonant circuit is provided. The wide-bandwidth resonant circuit includes a first node and a second node. The wide-bandwidth resonant circuit also includes a positive resonant circuit coupled between the first node and the second node. The positive resonant circuit is configured to resonate at a resonance frequency to present a respective lower impedance between the first node and the second node below the resonance frequency. The wide-bandwidth resonant circuit also includes a negative resonant circuit coupled between the first node and the second node and in parallel to the positive resonant circuit. The negative resonant circuit is configured to resonate at the resonance frequency to present a respective lower impedance between the first node and the second node above the resonance frequency.

In another aspect, a wide-bandwidth signal filter circuit is provided. The wide-bandwidth signal filter circuit includes a wide-bandwidth resonant circuit. The wide-bandwidth resonant circuit includes a first node and a second node. The wide-bandwidth resonant circuit also includes a positive resonant circuit coupled between the first node and the second node. The positive resonant circuit is configured to resonate at a resonance frequency to present a respective lower impedance between the first node and the second node below the resonance frequency. The wide-bandwidth resonant circuit also includes a negative resonant circuit coupled between the first node and the second node and in parallel to the positive resonant circuit. The negative resonant circuit is configured to resonate at the resonance frequency to present a respective lower impedance between the first node and the second node above the resonance frequency. The wide-bandwidth signal filter circuit also includes a load circuit coupled between the first node and the second node.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a wide-bandwidth resonant circuit. In embodiment disclosed herein, the wide-bandwidth resonant circuit includes a positive resonant circuit coupled in parallel to a negative resonant circuit. The positive resonant circuit and the negative resonant circuit can be configured to collectively exhibit certain impedance characteristics across a wide bandwidth. As a result, it is possible to utilize the wide-bandwidth resonant circuit to support a variety of wide-bandwidth applications, such as in a wide-bandwidth signal filter circuit.

Figure 1:
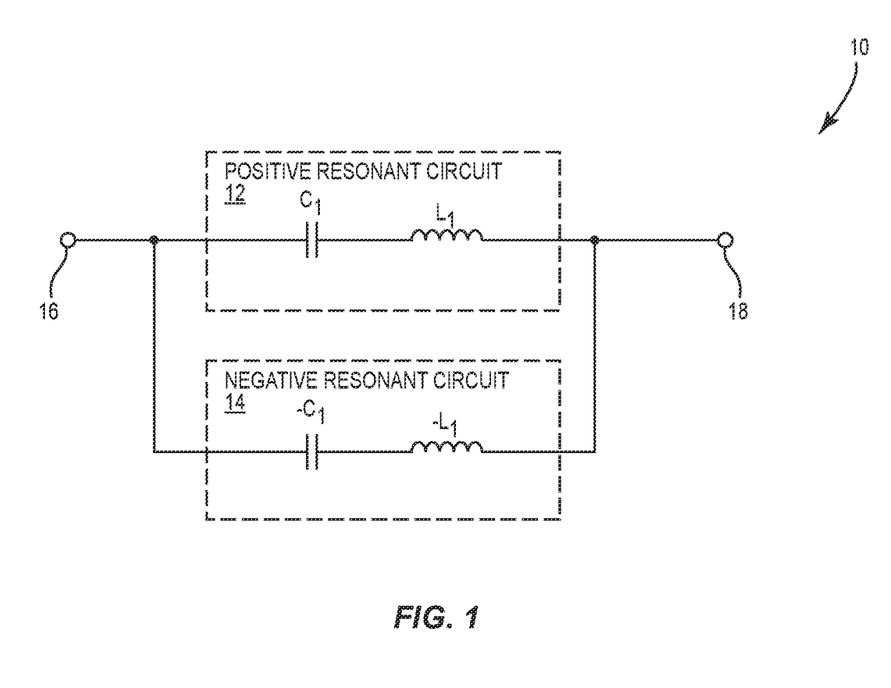
FIG. 1 is a schematic diagram of an exemplary equivalent resonant circuit that includes a positive resonant circuit coupled in parallel to a negative resonant circuit.

FIG. 1 is a schematic diagram of an exemplary equivalent resonant circuit 10 that includes a positive resonant circuit 12 coupled in parallel to a negative resonant circuit 14 between a first node 16 and a second node 18. In a non-limiting example, each of the positive resonant circuit 12 and the negative resonant circuit 14 is an inductor-capacitor (LC) resonant circuit. More specifically, the positive resonant circuit 12 includes a positive capacitor $C_1$ (having a positive capacitance $C_1$) coupled in series with a positive inductor $L_1$ (having a positive inductance $L_1$). The negative resonant circuit 14 includes a negative capacitor $-C_1$ (having a negative capacitance $-C_1$) coupled in series with a negative inductor $-L_1$ (having a negative inductance $-L_1$). As discussed in detail below, the equivalent resonant circuit 10 can exhibit certain impedance characteristics across a wide bandwidth, thus making it possible to employ the equivalent resonant circuit 10 in a variety of wide-bandwidth applications, including but not limited to a wide-bandwidth signal filter, an impedance inverter, and so on.

However, it may be difficult to provide the negative capacitor $-C_1$ having the negative capacitance $-C_1$ and the negative inductor $-L_1$ having the negative inductance $-L_1$ in a real circuit. As such, it is necessary to explore alternative methods for providing the negative capacitance $-C_1$ and the negative inductance $-L_1$ in the negative resonant circuit 14. As discussed in FIGS. 2A-2C, it is possible to provide the negative capacitance $-C_1$ and the negative inductance $-L_1$ in the negative resonant circuit 14 based on an inductor network.

Figure 2A:
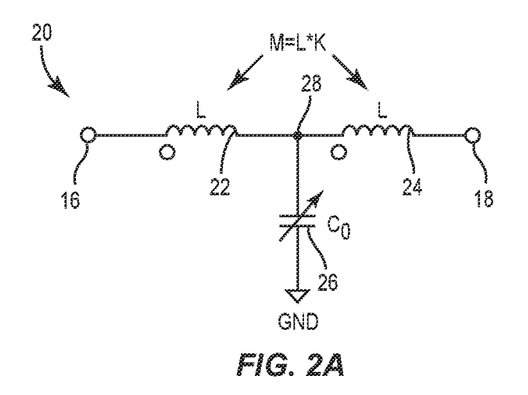
FIGS. 2A-2C are schematic diagrams providing exemplary illustrations as to how the negative resonant circuit in the equivalent resonant circuit of FIG. 1 can be implemented based on an inductor network.

FIG. 2A is a schematic diagram of an inductor network 20 that can be utilized to provide the negative capacitance $-C_1$ and the negative inductance $-L_1$ in the equivalent resonant circuit 10 of FIG. 1. Common elements between FIGS. 1 and 2A are shown therein with common element numbers and will not be re-described herein.

In a non-limiting example, the inductor network 20 includes a first inductor 22, a second inductor 24, and a tunable capacitor 26. The first inductor 22 is coupled between the first node 16 and a middle node 28. The second inductor 24 is coupled between the middle node 28 and the second node 18. The tunable capacitor 26 is coupled between the middle node 28 and a ground (GND). The first inductor 22 and the second inductor 24 each has an inductance L and collectively provide a mutual inductance M based on a coupling factor K (0<K<1). The tunable capacitor 26 can be tuned to provide a capacitance $C_0$.

Figure 2B:
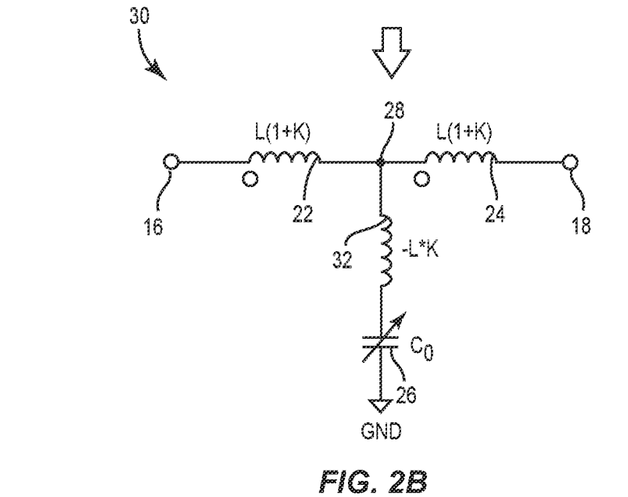

FIG. 2B shows an equivalent electrical network 30 of the inductor network 20 in FIG. 2A. Common elements between FIGS. 2A and 2B are shown therein with common element numbers and will not be re-described herein.

In the equivalent electrical network 30, each of the first inductor 22 and the second inductor 24 can have an inductance L*(1+K). The equivalent electrical network 30 further includes a third inductor 32 that is coupled between the middle node 28 and the tunable capacitor 26. The third inductor 32 has an inductance that equals –L*K.

Figure 2C:
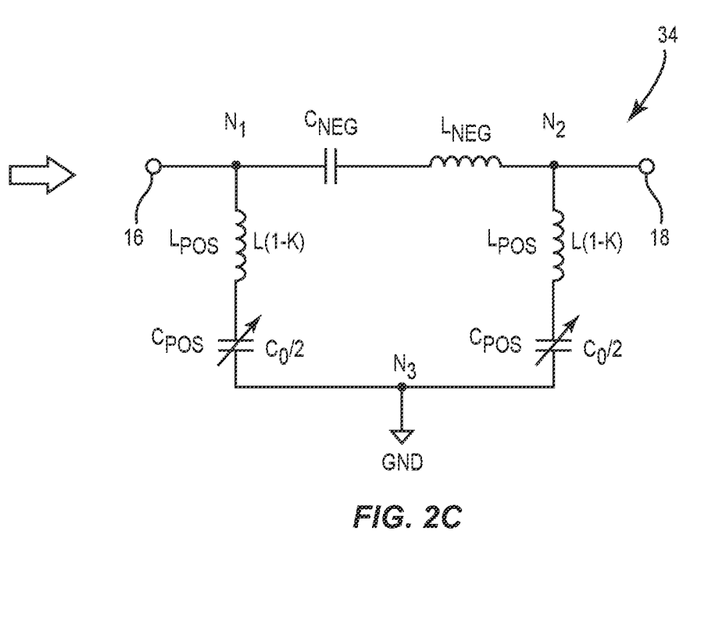

The equivalent electrical network 30 can be transformed from a T-shaped network to a π-shaped network that presents a negative capacitor equivalent to the negative capacitor $-C_1$ and a negative inductor equivalent to the negative inductor $-L_1$ in the equivalent resonant circuit 10 of FIG. 1. In this regard, FIG. 2C is a schematic diagram of an exemplary π-shaped network 34 that presents an equivalent negative capacitor $C_{NEG}$ and an equivalent negative inductor $L_{NEG}$. Common elements between FIGS. 2B and 2C are shown therein with common element numbers and will not be re-described herein.

As shown in FIG. 2C, the equivalent negative capacitor $C_{NEG}$ (having an equivalent negative capacitance $C_{NEG}$) is coupled in series with the equivalent negative inductor $L_{NEG}$ (having an equivalent negative inductance $L_{NEG}$) between nodes $N_1$ and $N_2$. The π-shaped network 34 also includes an equivalent positive inductor $L_{POS}$ coupled in series with an equivalent positive capacitor Coos between nodes $N_1$ and $N_3$ as well as between nodes $N_2$ and $N_3$. The equivalent positive inductor $L_{POS}$ has an inductance of L(1−K) and the equivalent positive capacitor Coos has a capacitance of ½ $C_0$.

The π-shaped network 34 can be turned (e.g., based on L, $C_0$ and/or K) to provide the equivalent negative capacitance $C_{NEG}$ and the equivalent negative inductance $L_{NEG}$ above an operating frequency $f_{oper}$. In a non-limiting example, the operating frequency $fo_per$, the equivalent negative capacitance $C_{NEG}$, and the equivalent negative inductance $L_{NEG}$ can be approximated in accordance with equations (Eq. 1.1, 1.2, and 1.3) below.

$$f_{oper} = \frac{1}{2\pi\sqrt{L*C_0*K}} \quad \text{(Eq. 1.1)}$$

$$C_{NEG} = -\frac{C_0*K}{2*(1+K)} \quad \text{(Eq. 1.2)}$$

$$L_{NEG} = -\frac{L*(1-K^2)}{K} \quad \text{(Eq. 1.3)}$$

Given that the π-shaped network 34 can provide the equivalent negative capacitance $C_{NEG}$, and the equivalent negative inductance $L_{NEG}$ above the operating frequency $f_{oper}$, it is thus possible to employ the inductor network 20 of FIG. 2A to provide the negative capacitor $-C_1$ having the negative capacitance $-C_1$ and the negative inductor $-L_1$ having the negative inductance $-L_1$ in the equivalent resonant circuit 10 of FIG. 1.

Figure 3:
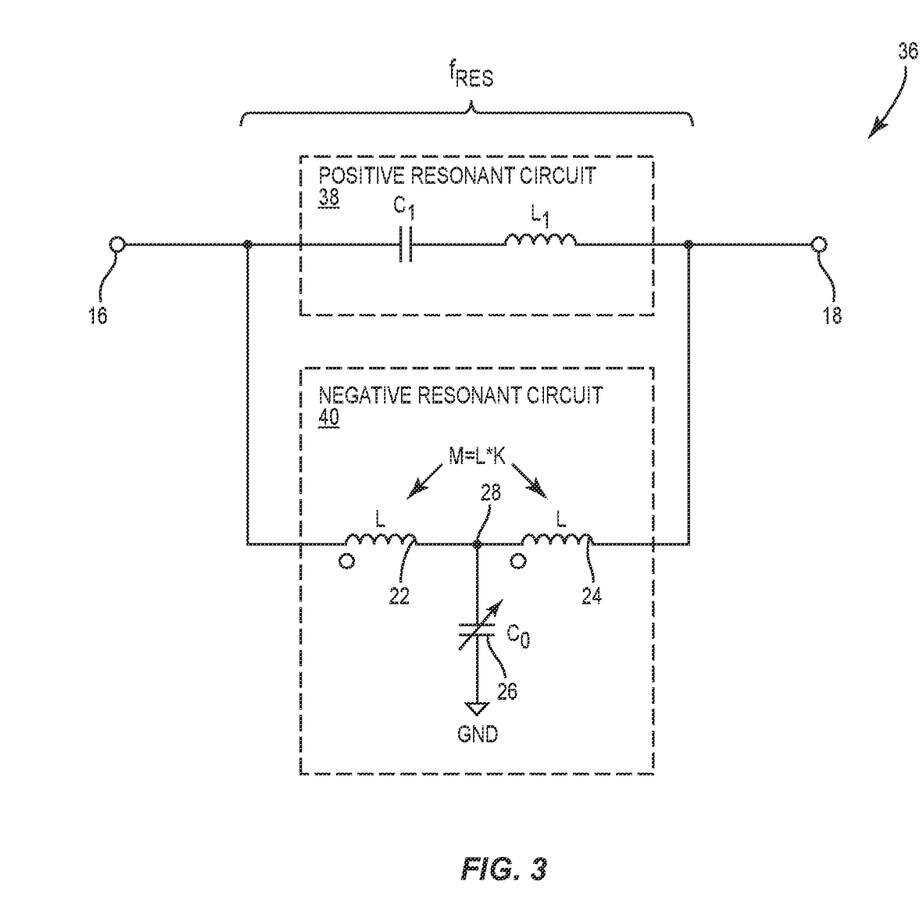
FIG. 3 is a schematic diagram of an exemplary wide-bandwidth resonant circuit configured according to an embodiment of the present disclosure to exhibit certain impedance characteristics.

FIG. 3 is a schematic diagram of an exemplary wide-bandwidth resonant circuit 36 including a positive resonant circuit 38 configured according to the positive resonant circuit 12 in FIG. 1 and a negative resonant circuit 40 configured according to the inductor network 20 of FIG. 2A. Common elements between FIGS. 1, 2A, and 3 are shown therein with common element numbers and will not be re-described herein.

As shown in the equations (Eq. 1.2 and 1.3), it is possible to tune the negative resonant circuit 40 based on L, $C_0$, and/or K such that an absolute value of the equivalent negative capacitance $C_{NEG}$ and an absolute value of the equivalent negative inductance $L_{NEG}$ can be equal to the positive capacitance $C_1$ and the positive inductance $L_1$, respectively ($|C_{NEG}|=C_1$ and $|L_{NEG}|=L_1$). As such, the positive resonant circuit 38 and the negative resonant circuit 40 can both resonate at a resonance frequency $F_{RES}$ to present certain impedance characteristics across a wide bandwidth. As a result, it is possible to utilize the wide-bandwidth resonant circuit 36 for a variety of wide-bandwidth applications, such as in a wide-bandwidth signal filter circuit, an impedance inverter, and so on.

Figure 4:
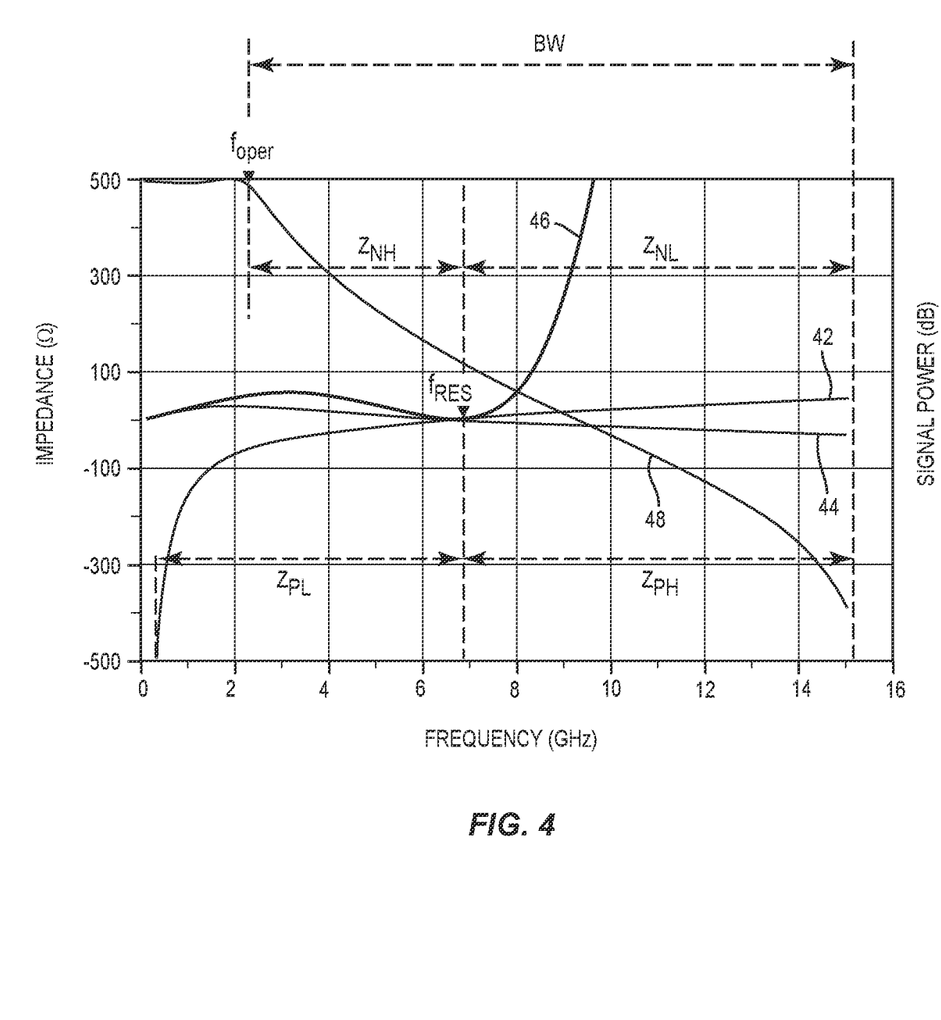
FIG. 4 is a graphic diagram providing an exemplary illustration of the impedance characteristics exhibited by the wide-bandwidth resonant circuit of FIG. 3 across a wide bandwidth.

FIG. 4 is a graphic diagram providing an exemplary illustration of the impedance characteristics exhibited by the wide-bandwidth resonant circuit 36 of FIG. 3 across a wide bandwidth BW. The graphic diagram shown in FIG. 4 includes a first impedance curve 42, a second impedance curve 44, a third impedance curve 46, and a fourth impedance curve 48.

The first impedance curve 42 illustrates the impedance characteristics exhibited by the positive resonant circuit 38 in FIG. 3. As show, the positive resonant circuit 38 resonates at a resonance frequency $F_{RES}$ to present a respective lower impedance $Z_{PL}$ below the resonance frequency $f_{RES}$ and a respective higher impedance $Z_{PH}$ above the resonance frequency $f_{RES}$.

The second impedance curve 44 illustrates the impedance characteristics exhibited by the negative resonant circuit 40 in FIG. 3. As show, the negative resonant circuit 40 resonates at the resonance frequency $f_{RES}$ to present a respective higher impedance $Z_{NH}$ below the resonance frequency $f_{RES}$ and a respective lower impedance $Z_{NH}$ above the resonance frequency $f_{RES}$. As previously discussed in FIGS. 2A-2C, the inductor network 20 can only provide the equivalent negative capacitance $C_{NEG}$ and the equivalent negative inductance $L_{NEG}$ above the operating frequency $f_{oper}$, which is lower than the resonance frequency $f_{RES}$. As such, the negative resonant circuit 40 is only able to present the respective higher impedance $Z_{NH}$ between the operating frequency $f_{oper}$ and the resonance frequency $f_{RES}$.

The third impedance curve 46 shows an overall effect of the counter-acting impedance characteristics between the positive resonant circuit 38 and the negative resonant circuit 40 across the wide bandwidth BW.

The fourth impedance curve 48 illustrates an overall filtering performance of the wide-bandwidth resonant circuit 36 of FIG. 3 across the wide bandwidth BW. Specifically, the wide-bandwidth resonant circuit 36 can pass a signal below the operating frequency $f_{oper}$ and block a signal above the operating frequency $f_{oper}$. As such, the wide-bandwidth resonant circuit 36 can be utilized to provide a band-pass or band-stop signal filter.

Figure 5A:
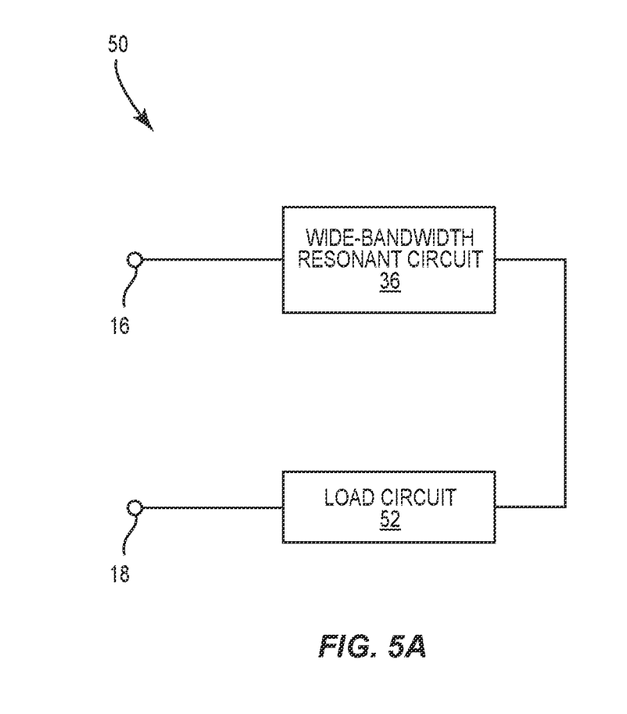
FIG. 5A is a schematic diagram of an exemplary wide-bandwidth signal filter circuit configured to operate as a wide-bandwidth band-stop filter based on the wide-bandwidth resonant circuit of FIG. 3.

FIG. 5A is a schematic diagram of an exemplary wide-bandwidth signal filter circuit 50 configured to operate as a wide-bandwidth band-stop filter based on the wide-bandwidth resonant circuit 36 of FIG. 3. Common elements between FIGS. 3 and 5A are shown therein with common element numbers and will not be re-described herein.

The wide-bandwidth signal filter circuit 50 includes a load circuit 52 coupled in series with the wide-bandwidth resonant circuit 36 between the first node 16 and the second node 18. According to previous discussions in FIG. 4, the wide-bandwidth signal filter circuit 50 can function as a wide-bandwidth band-stop signal filter to block a signal across the wide bandwidth BW above the operating frequency $f_{oper}$.

Figure 5B:
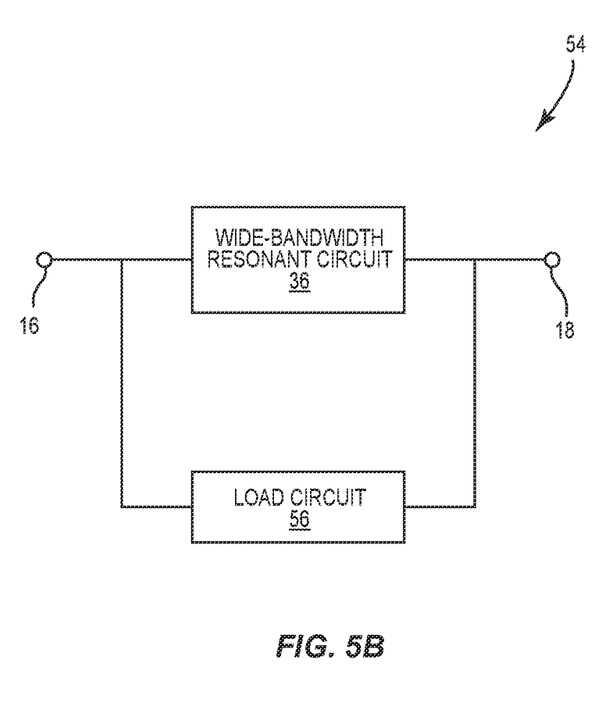
FIG. 5B is a schematic diagram of an exemplary wide-bandwidth signal filter circuit configured to operate as a wide-bandwidth band-pass filter based on the wide-bandwidth resonant circuit of FIG. 3.

FIG. 5B is a schematic diagram of an exemplary wide-bandwidth signal filter circuit 54 configured to operate as a wide-bandwidth band-pass filter based on the wide-bandwidth resonant circuit 36 of FIG. 3. Common elements between FIGS. 3 and 5B are shown therein with common element numbers and will not be re-described herein.

The wide-bandwidth signal filter circuit 54 includes a load circuit 56 coupled in parallel to the wide-bandwidth resonant circuit 36 between the first node 16 and the second node 18. According to previous discussions in FIG. 4, the wide-bandwidth signal filter circuit 54 can function as a wide-bandwidth band-pass signal filter to stop a signal from being shunted to ground across the wide bandwidth BW above the operating frequency $f_{oper}$.

Figure 6:
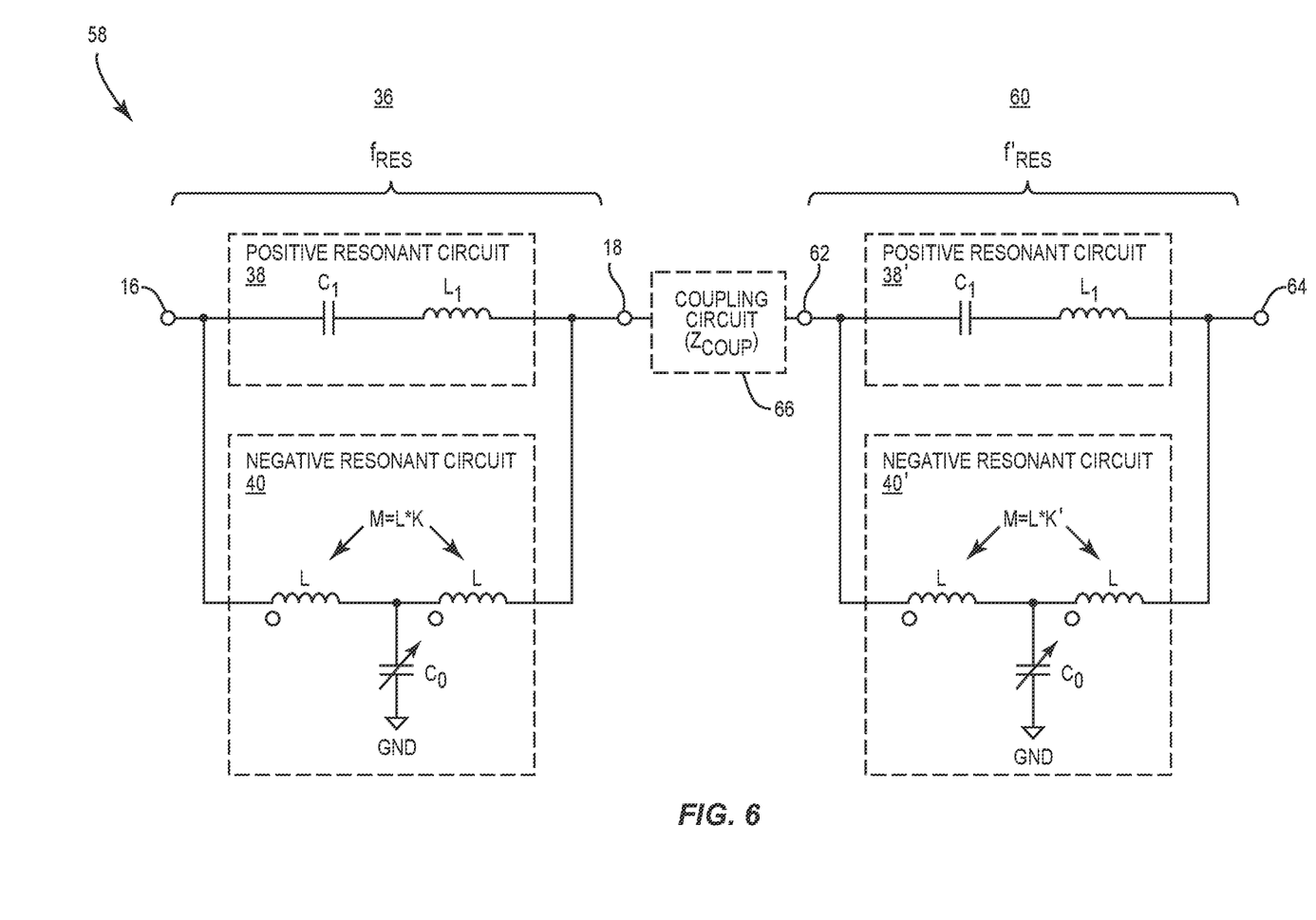
FIG. 6 is a schematic diagram of an exemplary wide-bandwidth resonant circuit configured according to an alternative embodiment of the present disclosure.

The wide-bandwidth resonant circuit 36 of FIG. 3 can be adapted to operate in more than one wide bandwidth. In this regard, FIG. 6 is a schematic diagram of an exemplary wide-bandwidth resonant circuit 58 configured according to an alternative embodiment of the present disclosure. Common elements between FIGS. 3 and 6 are shown therein with common element numbers and will not be re-described herein.

The wide-bandwidth resonant circuit 58 includes a second wide-bandwidth resonant circuit 60 coupled in series with the wide-bandwidth resonant circuit 36. The second wide-bandwidth resonant circuit 60 includes a third node 62 coupled to the second node 18 and a fourth node 64. In a non-limiting example, the third node 62 can be coupled to the second node 18 via a coupling circuit 66 having a coupling impedance $Z_{COUP}$.

The second wide-bandwidth resonant circuit 60 includes a second positive resonant circuit 38' and a second negative resonant circuit 40'. The second positive resonant circuit 38' is coupled between the third node 62 and the fourth node 64. The second positive resonant circuit 38' is configured to resonate at a second resonance frequency $f'_{RES}$ to present a respective lower impedance between the third node 62 and the fourth node 64 below the second resonance frequency $f'_{RES}$. The second negative resonant circuit 40' is coupled between the third node 62 and the fourth node 64 and in parallel to the second positive resonant circuit 38'. The second negative resonant circuit 40' is configured to resonate at the second resonance frequency $f'_{RES}$ to present a respective lower impedance between the third node 62 and the fourth node 64 above the second resonance frequency $f'_{RES}$.

Like the wide-bandwidth resonant circuit 36, the second wide-bandwidth resonant circuit 60 is configured to utilize the positive resonant circuit 12 in FIG. 1 as the second positive resonant circuit 38' and the inductor network 20 of FIG. 2A as the second negative resonant circuit 40'. Accordingly, the second wide-bandwidth resonant circuit 60 is configured to operate based on the same principles as the wide-bandwidth resonant circuit 36.

Understandably, however, the L, $C_0$, and K in the second wide-bandwidth resonant circuit 60 can be determined independently from the L, $C_0$, and K in the wide-bandwidth resonant circuit 36. In this regard, the second resonance frequency f'RES of the second wide-bandwidth resonant circuit 60 can be different from or identical to the resonance frequency $f_{RES}$ of the wide-bandwidth resonant circuit 36.

Those skilled in the art will recognize improvements and modifications to the embodiments of the present disclosure. All such improvements and modifications are considered within the scope of the concepts disclosed herein and the claims that follow.

What is claimed is:

1. A wide-bandwidth resonant circuit comprising:
   a first node and a second node;
   a positive resonant circuit coupled between the first node and the second node, the positive resonant circuit is configured to resonate at a resonance frequency to present a respective lower impedance between the first node and the second node below the resonance frequency; and
   a negative resonant circuit coupled between the first node and the second node and in parallel to the positive resonant circuit, the negative resonant circuit is configured to resonate at the resonance frequency to present a respective lower impedance between the first node and the second node above the resonance frequency.

2. The wide-bandwidth resonant circuit of claim 1, wherein:
   the positive resonant circuit is further configured to resonate at the resonance frequency to present a respective higher impedance between the first node and the second node above the resonance frequency; and
   the negative resonant circuit is further configured to resonate at the resonance frequency to present a respective higher impedance between the first node and the second node below the resonance frequency.

3. The wide-bandwidth resonant circuit of claim 1, wherein:
   the positive resonant circuit is further configured to present a positive capacitance in series with a positive inductance between the first node and the second node; and
   the negative resonant circuit is further configured to present an equivalent negative capacitance in series with an equivalent negative inductance between the first node and the second node.

4. The wide-bandwidth resonant circuit of claim 3, wherein:
   an absolute value of the equivalent negative capacitance equals the positive capacitance; and
   an absolute value of the equivalent negative inductance equals the positive inductance.

5. The wide-bandwidth resonant circuit of claim 3, wherein the positive resonant circuit comprises a capacitor having the positive capacitance and coupled in series with an inductor having the positive inductance.

6. The wide-bandwidth resonant circuit of claim 3, wherein the negative resonant circuit is further configured to present the equivalent negative capacitance in series with the equivalent negative inductance between the first node and the second node above an operating frequency.

7. The wide-bandwidth resonant circuit of claim 6, wherein:
   the operating frequency is lower than the resonance frequency; and
   the negative resonant circuit is further configured to present the respective higher impedance below the resonance frequency and above the operating frequency.

8. The wide-bandwidth resonant circuit of claim 6, wherein the negative resonant circuit comprises:
   a first inductor coupled between the first node and a middle node;
   a second inductor coupled between the middle node and the second node; and
   a tunable capacitor coupled between the middle node and a ground;
   wherein the first inductor, the second inductor, and the tunable capacitor are configured to collectively cause the equivalent negative capacitance to be presented in series with the equivalent negative inductance between the first node and the second node.

9. The wide-bandwidth resonant circuit of claim 8, wherein:
   the operating frequency is approximated as:

$$\frac{1}{2\pi\sqrt{L*C_0*K}};$$

the equivalent negative capacitance is approximated as:

$$-\frac{C_0}{2}*\frac{K}{1+K};$$

and
   the equivalent negative inductance is approximated as:

$$-L*\frac{1-K^2}{K};$$

wherein:
L represents a respective inductance of the first inductor and the second inductor;
K represents a coupling factor between the first inductor and the second inductor; and
$C_O$ represents a respective capacitance of the tunable capacitor.

10. A wide-bandwidth signal filter circuit comprising:
a wide-bandwidth resonant circuit comprising:
   a first node and a second node;
   a positive resonant circuit coupled between the first node and the second node, the positive resonant circuit is configured to resonate at a resonance frequency to present a respective lower impedance between the first node and the second node below the resonance frequency; and
   a negative resonant circuit coupled between the first node and the second node and in parallel to the positive resonant circuit, the negative resonant circuit is configured to resonate at the resonance frequency to present a respective lower impedance between the first node and the second node above the resonance frequency; and
a load circuit coupled between the first node and the second node.

11. The wide-bandwidth signal filter circuit of claim 10, further comprising a second wide-bandwidth resonant circuit coupled in series with the wide-bandwidth resonant circuit, the second wide-bandwidth resonant circuit comprising:
   a third node coupled to the second node and a fourth node;
   a second positive resonant circuit coupled between the third node and the fourth node, the second positive resonant circuit is configured to resonate at a second resonance frequency to present a respective lower impedance between the third node and the fourth node below the second resonance frequency; and
   a second negative resonant circuit coupled between the third node and the fourth node and in parallel to the second positive resonant circuit, the second negative resonant circuit is configured to resonate at the second resonance frequency to present a respective lower impedance between the third node and the fourth node above the second resonance frequency.

12. The wide-bandwidth signal filter circuit of claim 10, wherein the load circuit is coupled in series with the wide-bandwidth resonant circuit between the first node and the second node.

13. The wide-bandwidth signal filter circuit of claim 10, wherein the load circuit is coupled in parallel to the wide-bandwidth resonant circuit between the first node and the second node.

14. The wide-bandwidth signal filter circuit of claim 10, wherein:
   the positive resonant circuit is further configured to resonate at the resonance frequency to present a respective higher impedance between the first node and the second node above the resonance frequency; and
   the negative resonant circuit is further configured to resonate at the resonance frequency to present a respective higher impedance between the first node and the second node below the resonance frequency.

15. The wide-bandwidth signal filter circuit of claim 10, wherein:
   the positive resonant circuit is further configured to present a positive capacitance in series with a positive inductance between the first node and the second node; and
   the negative resonant circuit is further configured to present an equivalent negative capacitance in series with an equivalent negative inductance between the first node and the second node.

16. The wide-bandwidth signal filter circuit of claim 15, wherein:
   an absolute value of the equivalent negative capacitance equals the positive capacitance; and
   an absolute value of the equivalent negative inductance equals the positive inductance.

17. The wide-bandwidth signal filter circuit of claim 15, wherein the positive resonant circuit comprises a capacitor having the positive capacitance and coupled in series with an inductor having the positive inductance.

18. The wide-bandwidth signal filter circuit of claim 15, wherein the negative resonant circuit is further configured to present the equivalent negative capacitance in series with the equivalent negative inductance between the first node and the second node above an operating frequency.

19. The wide-bandwidth signal filter circuit of claim 18, wherein:
   the operating frequency is lower than the resonance frequency; and
   the negative resonant circuit is further configured to present the respective higher impedance below the resonance frequency and above the operating frequency.

20. The wide-bandwidth signal filter circuit of claim 15, wherein the negative resonant circuit comprises:
   a first inductor coupled between the first node and a middle node;
   a second inductor coupled between the middle node and the second node; and
   a tunable capacitor coupled between the middle node and a ground;
   wherein the first inductor, the second inductor, and the tunable capacitor are configured to collectively cause the equivalent negative capacitance to be presented in series with the equivalent negative inductance between the first node and the second node.

* * * * *

UNITED STATES PATENT AND TRADEMARK OFFICE
CERTIFICATE OF CORRECTION

PATENT NO. : 11,742,818 B2
APPLICATION NO. : 17/412764
DATED : August 29, 2023
INVENTOR(S) : Nadim Khlat It is certified that error appears in the above-identified patent and that said Letters Patent is hereby corrected as shown below:

In the Specification

In Column 5, Line 3, replace "positive capacitor Coos" with --positive capacitor $C_{POS}$--.

In Column 5, Line 6, replace "positive capacitor Coos" with --positive capacitor $C_{POS}$--.

In Column 5, Line 11, replace "operating frequency fo$_p$er," with --operating frequency $f_{oper}$,--.

Signed and Sealed this
Twenty-sixth Day of December, 2023

Katherine Kelly Vidal
*Director of the United States Patent and Trademark Office*